United States Patent
Shoemaker et al.

(10) Patent No.: US 9,182,456 B2
(45) Date of Patent: Nov. 10, 2015

(54) MAGNETIC FIELD SENSOR FOR SENSING ROTATION OF AN OBJECT

(75) Inventors: Eric Shoemaker, Pembroke, NH (US); Michael C. Doogue, Manchester, NH (US); Andreas P. Friedrich, Metz-Tessy (FR); Andrea Foletto, Annecy (FR)

(73) Assignee: Allegro Microsystems, LLC, Worcester, MA (US)

( * ) Notice: Subject to any disclaimer, the term of this patent is extended or adjusted under 35 U.S.C. 154(b) by 885 days.

(21) Appl. No.: 13/413,037

(22) Filed: Mar. 6, 2012

(65) Prior Publication Data
US 2013/0238278 A1 Sep. 12, 2013

(51) Int. Cl.
G01P 3/00 (2006.01)
G01R 33/07 (2006.01)
G01D 5/14 (2006.01)
G01D 5/244 (2006.01)

(52) U.S. Cl.
CPC .............. *G01R 33/077* (2013.01); *G01D 5/145* (2013.01); *G01R 33/075* (2013.01); *G01D 5/24438* (2013.01)

(58) Field of Classification Search
CPC ............. H01L 43/065; G01R 31/2829; G01R 33/093; G01R 33/07; G01R 33/075; G01R 33/0017; G01R 33/0035; G01R 33/095; G01R 33/06; G01R 33/286; G01R 33/323
See application file for complete search history.

(56) References Cited

U.S. PATENT DOCUMENTS

| | | |
|---|---|---|
| 4,668,914 A | 5/1987 | Kersten et al. |
| 4,761,569 A | 8/1988 | Higgs |
| 4,829,352 A | 5/1989 | Popovic et al. |
| 5,055,781 A | 10/1991 | Sakakibara et al. |
| 5,541,506 A | 7/1996 | Kawakita et al. |
| 5,572,058 A | 11/1996 | Biard |
| 5,612,618 A | 3/1997 | Arakawa |
| 5,619,137 A | 4/1997 | Vig et al. |
| 5,621,319 A | 4/1997 | Bilotti et al. |
| 5,657,189 A | 8/1997 | Sandhu |
| 5,694,038 A | 12/1997 | Moody et al. |
| 5,831,513 A | 11/1998 | Lue |

(Continued)

FOREIGN PATENT DOCUMENTS

DE 10 2005 014 509 B4 10/2006
DE 10 2006 037 226 A1 2/2008

(Continued)

OTHER PUBLICATIONS

Kejik et al., 'Ultra Low-Power Angular Position Sensor for High-speed Portable Applications', 2009, IEEE Publication, pp. 173-176.*

(Continued)

*Primary Examiner* — Elias Desta
(74) *Attorney, Agent, or Firm* — Daly, Crowley, Mofford & Durkee, LLP

(57) ABSTRACT

A magnetic field sensor uses an angle sensor to measure and angle of rotation of a target object to which a magnet is attached. The angle sensor in combination with electronics can generate an angle sensor output signal related to a direction of a magnetic field of the magnet. The angle sensor output signal can be compared to thresholds to generate a magnetic field sensor output signal the same as a known true power on state (TPOS) sensor output signal. A corresponding method is also described.

28 Claims, 8 Drawing Sheets

(56) References Cited

U.S. PATENT DOCUMENTS

| | | | |
|---|---|---|---|
| 5,844,411 A | 12/1998 | Vogt | |
| 5,942,895 A | 8/1999 | Popovic et al. | |
| 6,064,199 A | 5/2000 | Walter et al. | |
| 6,064,202 A | 5/2000 | Steiner et al. | |
| 6,091,239 A | 7/2000 | Vig et al. | |
| 6,100,680 A | 8/2000 | Vig et al. | |
| 6,166,535 A | 12/2000 | Irle et al. | |
| 6,232,768 B1 | 5/2001 | Moody et al. | |
| 6,236,199 B1 | 5/2001 | Irle et al. | |
| 6,265,864 B1 | 7/2001 | De Winter et al. | |
| 6,288,533 B1 | 9/2001 | Haeberli et al. | |
| 6,297,627 B1 | 10/2001 | Towne et al. | |
| 6,356,741 B1 | 3/2002 | Bilotti et al. | |
| 6,525,531 B2 | 2/2003 | Forrest et al. | |
| 6,542,068 B1 | 4/2003 | Drapp et al. | |
| 6,545,462 B2 | 4/2003 | Schott et al. | |
| 6,622,012 B2 | 9/2003 | Bilotti et al. | |
| 6,768,301 B1 | 7/2004 | Hohe et al. | |
| 6,969,988 B2 | 11/2005 | Kakuta et al. | |
| 7,030,606 B2 | 4/2006 | Kato et al. | |
| 7,038,448 B2 | 5/2006 | Schott et al. | |
| 7,085,119 B2 | 8/2006 | Bilotti et al. | |
| 7,119,538 B2 | 10/2006 | Blossfeld | |
| 7,159,556 B2 | 1/2007 | Yoshihara | |
| 7,235,968 B2 | 6/2007 | Popovic et al. | |
| 7,259,556 B2 | 8/2007 | Popovic et al. | |
| 7,307,824 B2 | 12/2007 | Bilotti et al. | |
| 7,362,094 B2 | 4/2008 | Voisine et al. | |
| 7,714,570 B2 | 5/2010 | Thomas et al. | |
| 7,746,065 B2 | 6/2010 | Pastre et al. | |
| 7,759,929 B2 | 7/2010 | Forsyth | |
| 7,872,322 B2 | 1/2011 | Schott et al. | |
| 7,911,203 B2 | 3/2011 | Thomas et al. | |
| 7,965,076 B2 | 6/2011 | Schott | |
| 7,994,774 B2 | 8/2011 | Thomas et al. | |
| 8,508,218 B2 * | 8/2013 | Reymond et al. | 324/207.2 |
| 2006/0011999 A1 | 1/2006 | Schott et al. | |
| 2006/0202291 A1* | 9/2006 | Kolb et al. | 257/421 |
| 2007/0029998 A1 | 2/2007 | Popovic et al. | |
| 2007/0149262 A1 | 6/2007 | Navntoft | |
| 2009/0121707 A1 | 5/2009 | Schott | |
| 2009/0174395 A1 | 7/2009 | Thomas et al. | |
| 2010/0156397 A1 | 6/2010 | Yabusaki et al. | |
| 2010/0164491 A1 | 7/2010 | Kejik et al. | |
| 2011/0248708 A1 | 10/2011 | Thomas et al. | |

FOREIGN PATENT DOCUMENTS

| | | |
|---|---|---|
| EP | 0 631 416 B1 | 12/1994 |
| EP | 0 875 733 B1 | 11/1998 |
| EP | 0 916 074 B1 | 5/1999 |
| EP | 2 000 814 A2 | 12/2008 |
| JP | 58-055688 A | 4/1983 |
| JP | 58-193403 | 11/1983 |
| JP | 2003-042709 | 2/2003 |
| JP | 2005-241269 | 9/2005 |
| JP | 2010-014607 | 1/2010 |
| JP | 2010-078366 | 4/2010 |
| WO | WO 98/10302 | 3/1998 |
| WO | WO 98/54547 | 12/1998 |
| WO | WO 00/02266 | 1/2000 |
| WO | WO 03/036732 A2 | 5/2003 |
| WO | WO 2004/025742 A1 | 3/2004 |
| WO | WO 2006/056289 A1 | 6/2006 |
| WO | WO 2006/074989 A2 | 7/2006 |
| WO | WO 2008 145662 A1 | 12/2008 |
| WO | WO 2009/124969 A1 | 10/2009 |

OTHER PUBLICATIONS

PCT International Preliminary Report on Patentability and Written Opinion of the ISA dated Sep. 18, 2014; for PCT Pat. App. No. PCT/US2013/020965; 12 pages.
PCT Search Report and Written Opinion of the ISA for PCT Pat. App. No. PCT/US2013/020965; 15 pages.
Taiwan Office Action with Search Report dated Jun. 25, 2014: for Taiwan Pat. App. No. 102101988; 10 pages.
Taiwan Office Action translation with Search Report dated Jun. 25, 2014; for Taiwan Pat. App. No. 102101988; 10 pages.
Email from Taiwan International Patent & Law Office dated Oct. 27, 2014; for Taiwan Pat. App. No. 102101988; 2 pages.
Taiwan Notice of Allowance dated Oct. 22, 2014; for Taiwan Pat. App. No. 102101988; 2 pages.
Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.
Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.
Allegro Microsystems, Inc.; "A1230 Data Sheet: Ultra-Sensitive Dual-Channel Quadrature Hall-Effect Bipolar Switch;" published Mar. 26, 2010; 16 sheets.
Allegro Microsystems, Inc.; "A1351 Data Sheet: High Precision Linear Hall Effect Sensor with a Push/Pull, Pulse Width Modulated Output," published Mar. 7, 2008; pp. 1-23.
Allegro Microsystems, Inc.; "A1360, A1361 and A1362 Data Sheet: Low-Noise Programmable Linear Hall Effect Sensors with Adjustable Bandwidth (50 kHz Maximum) and Analog Output;" published Mar. 18, 2008; pp. 1-25.
Allegro Microsystems, Inc.; "A3212 Data Sheet: Micropower, Ultra-Sensitive Hall-Effect Switch;" published Sep. 22, 2004; pp. 1-12.
Allegro Microsystems, Inc.; "ATS675LSE Data Sheet: Self-Calibrating TPOS Speed Sensor Optimized for Automotive Cam Sensing Applications;" published Jul. 11, 2008; pp. 1-13.
Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40.
Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.
Allegro Microsystems, Inc.; "A3425 Data Sheet: Dual, Chopper-Stabilized, Ultra-Sensitive Bipolar Hall-Effect Switch;" published Jun. 28, 2002; pp. 1-10.
Atherton et al.; "Sensor Signal Conditioning—an IC Designer's Perspective;" IEEE Electro International; Apr. 26-28, 1991; pp. 129-134.
Austria Microsystems; "AS5040 datasheet; 10-Bit Programmable Magnetic Rotary Encoder;" Revision 1.1; Jan. 2004; pp. 1-20.
Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.
Blanchard et al.; "Cylindrical Hall Device;" International Electron Devices Meeting; Dec. 8-11, 1996; pp. 541-544.
Burger et al.; "New fully integrated 3-D silicon Hall sensor for precise angular-position measurements;" Sensors and Actuators, A 67; May 1998; pp. 72-76.
Dwyer; Allegro Microsystems, Inc.; "AN296061 Data Sheet: Ring Magnet Speed Sensing for Electronic Power Steering;" published Jul. 21, 2009; pp. 1-4.
Freitas et al.; "Giant magnetoresistive sensors for rotational speed control;" Jorunal of Applied Physics, vol. 85, No. 8; Apr. 15, 1999; pp. 5459-5461.
Gilbert; "Technical Advances in Hall-Effect Sensing;" Allegro Microsystems, Inc. Product Description; May 10, 2008; 7 sheets.
Häberli et al.; "Contactless Angle Measurements by CMOS Magnetic Sensor with On Chip Read-Out Circuit;" The 8$^{th}$ International Conference on Solid-State Sensors and Actuators and Eurosensors IX; Jan. 25-29, 1995; pp. 134-137.
Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.
Hiligsmann et al.; "Monolithic 360 Degrees Rotary Position Sensor IC;" 2004 IEEE Proceedings of Sensors, vol. 3; Oct. 24-27, 2004; pp. 1137-1142.

(56) References Cited

OTHER PUBLICATIONS

Kejik et al.; "Circular Hall Transducer for Angular Position Sensing;" International Solid-State Sensors, Actuators and Microsystems Conference; Transducers; Jun. 2007; pp. 2593-2596.
Lou Law; "Angle Position Sensing with 2-Axis Hall ICs;" Sensors Magazine, vol. 20, No. 3; Mar. 2003; 7 sheets.
Masson et al.; "Multiturn and high precision through-shaft magnetic sensors;" Sensor + Text Conference; Proceedings II; May 2009; pp. 41-46.
Metz et al.; "Contactless Angle Measurement Using Four Hall Devices on Single Chip;"; International Conference on Solid State Sensors and Actuators; Transducers; vol. 1; Jun. 16-19, 1997; pp. 385-388.
Munter; "A Low-offset Spinning-current Hall Plate;" Sensors and Actuators, vol. A21-A23; Jan. 1990; pp. 743-746.
novotechnik Siedle Group; "How New Angular Positioning Sensor Technology Opens a Broad Range of New Applications;" Vert-X Technology; Dec. 2001; pp. 1-5.
Paranjape et al.; "A CMOS-compatible 2-D vertical Hall magnetic-field sensor using active carrier confinement and post-process micromachining;" The 8th International Conference on Solid-State Sensors and Acutators, Physical vol. 53, Issues 1-3; May 1996; pp. 278-283.
Petoussis et al.; "A Novel Hall Effect Sensor Using Elaborate Offset Cancellation Method;" Sensors & Transducers Journal, vol. 100, Issue 1; Jan. 2009; pp. 85-91.
Popovic; "Not-plate-like Hall magnetic sensors and their applications;" Sensors and Actuators A: Physical, vol. 85, Issues 1-3; Aug. 2000; pp. 9-17.
Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.
Roumenin; "Magnetic sensors continue to advance towards perfection;" Sensors and Actuators A: Physical, vol. 46-47, Issues 1-3; Jan.-Feb. 1995; pp. 273-279.
Schneider et al.; "Temperature Calibration of CMOS Magnetic Vector Probe for Contactless Angle Measurement System;" International Electron Devices Meeting; Dec. 8-11, 1996; pp. 533-536.
SENSIMA technology sa; "CVHD: a new concept of Angular Position Sensor;" Slide Presentation for Allegro Microsystems; Mar. 2009; 17 sheets.
Sentron; AN-101; "Angular position sensing with 2-Axis Hall IC 2SA-10;" Feb. 12, 2004; http://www.diegm.uniud.it/petrella/Azionamenti%20Elettrici%20II/Sensori%20e%20trasduttori/Data%20Sheet%20-%202SA-10.pdf; pp. 1-7.
van der Meer; et al; "CMOS quad spinning-current Hall-sensor system for compass application;" IEEE Proceedings of Sensors, vol. 3; Oct. 24-27, 2004; pp. 1434-1437.
Vogelgesang et al.; Robert Bosch GmbH; "GMR sensors in automotive application;" CS-SNS/ECS Slides Presentation; Mar. 2, 2005; 16 sheets.
Volder; "The CORDIC Trigonometric Computing Technique;" The Institute of Radio Engineers, Inc.; IRE Transactions on Electronic Computers, vol. EC, Issue 3; Sep. 1959; pp. 226-230.
Petrie; "Circular Vertical Hall Magnetic Field Sensing Element and Method with a Plurality of Continuous Output Signals;" U.S. Appl. No. 13/035,243, filed Feb. 25, 2011; 56 pages.
Melexis MLX 90324; ""Under-the-Hood" Triaxis Rotary Position feat. SENT Protocol;" 3901090324 Data Sheet; Dec. 2008; 40 pages.
Letter to Taiwan International Patent & Law Office dated Sep. 4, 2014; for Taiwan Pat. App. No. 102101986; 6 pages.
Marked-Up Specification mailed Sep. 4, 2014; for Taiwan Pat. App. No. 102101988; 32 pages.
Banjevic; "High Bandwidth CMOS Magnetic Sensors Based on the Miniaturized Circular Vertical Hall Device;" Sep. 2011; 153 pages.
Allegro Microsystems, Inc.; "High Precision Linear Hall Effect Sensor IC with a Push/Pull, Pulse Width Modulated Output;" A1351; pp. 1-23.
Allegro Microsystems, Inc.; "High Precision 2-Wire Linear Hall Effect Sensor IC with a Pulse Width Modulated Output;" A1354; pp. 1-22.
Allegro Microsystems, Inc.; "High Precision Linear Hall-Effect Sensor with an Open Drain Pulse Width Modulated Output;" A1356; pp. 1-20.
Allegro Microsystems, Inc.; "Low-Noise Programmable Linear Hall Effect Sensor ICs with Adjustable Bandwidth (50 kHz Maximum) and Analog Output;" A1360, A1361 and A1362; pp. 1-25.
Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-371.
Kejik, et al.; "Purley CMOS Angular Position Sensor Based on a New Hall Microchip;" 34th Annual Conference of IEEE Industrial Electronics; IECON; Nov. 10-13, 2008; pp. 1777-1781.
Kejik,.et al.; "Ultra Low-Power Angular Position Sensor for High-Speed Portable Applications;" 2009 IEEE Sensors Conference; Oct. 25-28, 2009; pp. 173-176.
Reymond, et al.; "True 2D CMOS Integrated Hall Sensor;" 2007 IEEE Sensors Conference; Oct. 28-31, 2007; pp. 860-863.
Gerhauser; "Intelligente 3D-Magnetfeld Snesorik;" Fraunhofer-Institut for Integrierte Schaltungen IIS; www.iis.fraunhofer.de/asic/analog; Oct. 2009; 2 pages.
Melexis Microelectronic Integrated Systems; MLX90333; "Triaxis 3D-Joystick Position Sensor;" Data Sheet; Mar. 2009; 43 pages.
MEMSIC Corporation; AN-00MM-004; "Electronic Tilt Compensation;" Mar. 2008; 5 pages.
MEMSIC Corporation; AN-00MM-003; "Magnetic Sensor Calibration;" Mar. 2008; 5 pages.
MEMSIC Corporation; AN-00MM-002; "Magnetometer Soldering Methodology;" Jun. 2008; 2 pages.
MEMSIC Corporation; AN-00MM-001; "Magnetometer Fundamentals;" Jun. 2008; 6 pages.
MEMSIC Corporation; AN-00MM-005; "Magnetic Sensor Placement Guidelines;" Oct. 2008; 2 pages.
MEMSIC Corporation; MMC312xMQ; "Tri-axis Magnetic Sensor, with I$^2$C Interface;" Aug. 14, 2008; 9 pages.
MEMSIC Corporation; MMC314xMS; "Ultra Small 3-axis Magnetic Sensor, with I$^2$C Interface;" Mar. 31, 2010; 8 pages.
Micronas GmbH; "HAL® 3625 Programmable Direct Angle Sensor;" Product Information; Sep. 2009; 2 pages.
European Response received May 1, 2015; for European Pat. App. No. 13702526,8; 10 pages.

* cited by examiner

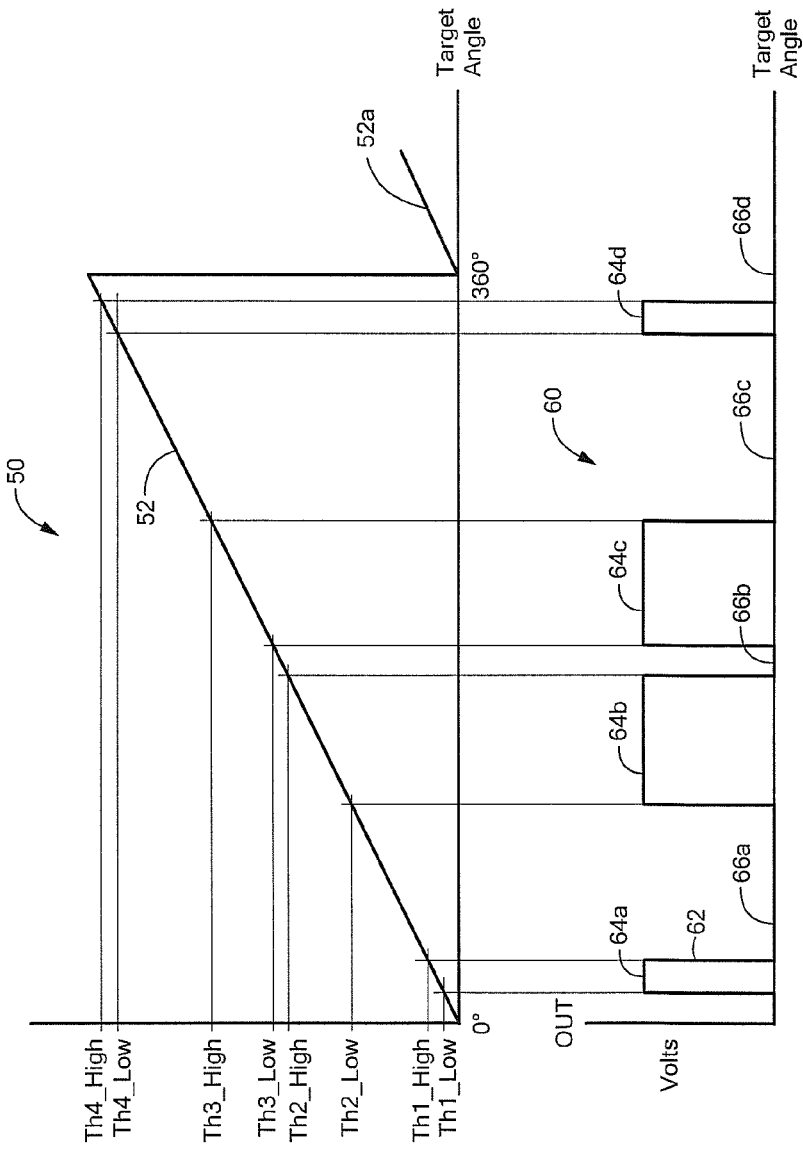

MAGNETIC FIELD SENSOR FOR SENSING ROTATION OF AN OBJECT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors for sensing a rotation of an object and, more particularly, to a magnitude field sensor that generates a multi-state signal that can be used to identify an absolute angle rotation of the object.

BACKGROUND OF THE INVENTION

Various types of magnetic field sensing elements are known, including Hall effect elements and magnetoresistance elements. Magnetic field sensors generally include a magnetic field sensing element and other electronic components. Some magnetic field sensors also include a fixed permanent magnet.

Magnetic field sensors provide an electrical signal representative of a sensed magnetic field, or, in some embodiments, fluctuations of the magnetic field associated with the magnet. In the presence of a moving ferromagnetic object, the magnetic field signal sensed by the magnetic field sensor varies in accordance with a shape or profile of the moving ferromagnetic object.

Magnetic field sensors are often used to detect movement of features of a ferromagnetic gear, such as gear teeth and/or gear slots. A magnetic field sensor in this application is commonly referred to as a "gear tooth" sensor.

In some arrangements, the gear is placed upon a target object, for example, a camshaft in an engine, thus it is the rotation of the target object (e.g., camshaft) that is sensed by detection of the moving features of the gear. Gear tooth sensors are used, for example, in automotive applications to provide information to an engine control processor for ignition timing control, fuel management, and other operations.

Information provided by the gear tooth sensor to the engine control processor can include, but is not limited to, an absolute angle of rotation of a target object (e.g., a camshaft) as it rotates, and a direction of rotation. With this information, the engine control processor can adjust the timing of firing of the ignition system and the timing of fuel injection by the fuel injection system.

Many types of magnetic field sensors do not provide an accurate output signal (e.g., indication of absolute angle of rotation of an object) immediately upon movement of the target object from zero rotating speed and/or upon movement slowing to zero rotating speed, but instead provide an accurate output signal only once the target object has moved through a substantial rotation or is moving with substantial speed. For example, in one type of magnetic field sensor described in U.S. Pat. No. 6,525,531, issued Feb. 25, 2003, a positive digital-to-analog converter (PDAC) and a negative digital-to-analog converter (NDAC) track positive and negative peaks of magnetic field signal, respectively, for use in generating a threshold signal. A varying magnetic field signal is compared to the threshold signal. However, the outputs of the PDAC and the NDAC may not be accurate indications of the positive and negative peaks of the magnetic field signal until several cycles of the signal (i.e., signal peaks) occur (i.e., until several gear teeth have passed). This type of magnetic field sensor, in which the threshold signal is a function of the positive and negative peaks of the magnetic field signal, is referred to herein as a so-called "running mode detector."

In contrast, a "true power on state" (TPOS) detector can provide an accurate output signal (e.g., indication of absolute angle of rotation) shortly after movement of a target object (e.g., camshaft) from zero rotating speed or also shortly before movement slowing to zero rotating speed. Furthermore, even when the target object is not moving, the TPOS detector can provide an indication of whether the TPOS detector is in front of a tooth or a valley. However, when the target object is stationary, the conventional TPOS detector is not able to identify an absolute or relative angle of rotation of the target object. The TPOS detector can be used in conjunction with a running mode detector, both providing information to the engine control processor.

As described above, the conventional TPOS detector provides an accurate output signal with only a small initial rotation of the target object, and before the running mode detector can provide an accurate output signal. The TPOS detector can provide information to the engine control processor that can be more accurate than information provided by the running mode detector for time periods at the beginning and at the end of rotation of the target object (e.g., start and stop of the engine and camshaft), but which may be less accurate when the object is rotating at speed. When the object is rotating at speed, the engine control processor can primarily use rotation information provided by the running mode detector. In most conventional applications, once the magnetic field sensor switches to use the running mode detector, it does not return to use the TPOS detector until the target object stops rotating or nearly stops rotating.

A conventional TPOS detector is described in U.S. Pat. No. 7,362,094, issued Apr. 22, 2008. The conventional TPOS detector includes a comparator for comparing the magnetic field signal to a fixed, often trimmed, threshold signal. The conventional TPOS detector can be used in conjunction with and can detect rotational information about a TPOS cam (like a gear), which is disposed upon a target object, e.g., an engine camshaft, configured to rotate.

An output signal from a conventional TPOS detector has at least two states, and typically a high and a low state. The state of the conventional TPOS output signal is high at some times and low at other times as the target object rotates, in accordance with features on the TPOS cam attached to the target object. An output signal from a conventional TPOS detector is shown and described below in conjunction with FIG. 2.

Though the TPOS detector provides rotation information (e.g., angle of rotation) faster than the running mode detector once a target object begins to rotate, it does not necessarily provide the rotation information immediately at the start of the rotation.

Thus, it would be desirable to provide a magnetic field sensor and technique that can generate a signal representative of at least the absolute angle of rotation of a target object, either continuously, e.g., when the target object is not rotating, or, at least when the target object rotates through only a very small number of degrees, smaller than for a conventional TPOS detector. It would also be desirable to provide a magnetic field sensor and technique for which the output signal is the same as or similar to the output signal of a known TPOS detector. Having characteristics of a known TPOS detector, the magnetic field sensor could be used in an engine control system without modification to the conventional engine control processor or software code used by the engine control processor.

SUMMARY OF THE INVENTION

The present invention provides a magnetic field sensor and technique that can generate an accurate signal representative of at least the absolute angle of rotation of a target object, either continuously, including when the target object is not rotating, or, when the target object rotates through only a very small number of degrees, smaller than for a conventional TPOS detector. In some embodiments, the present invention also provides a magnetic field sensor and technique for which the output signal is the same as or similar to the output signal of a known TPOS detector (or another known type of rotation detector). Having characteristics of a known TPOS detector (or another known type of rotation detector), the magnetic field sensor could, in some embodiments, be used in an engine control system without modification to the conventional engine control processor or software code used by the engine control processor.

In accordance with one aspect of the present invention, a magnetic field sensor for sensing a position of an object configured to rotate includes a plurality of magnetic field sensing elements. The plurality of magnetic field sensing elements is configured to generate a respective plurality of magnetic field sensing element output signals responsive to a magnetic field having a direction component in an x-y plane parallel to the first major surface of the semiconductor substrate, the x-y plane having an x-direction and a y-direction orthogonal to the x-direction. The magnetic field sensor also includes an angle detection circuit coupled to receive a signal representative of the plurality of magnetic field sensing element output signals, and configured to generate an x-y angle signal indicative of an angle of the direction component of the magnetic field in the x-y plane. The magnetic field sensor also includes a thresholding processor coupled to receive the x-y angle signal, configured to compare a plurality of threshold values with the x-y angle signal to generate a thresholded signal having at least two states. The thresholded signal is in one of the at least two states at some times and in another one of the at least two states at other times as the direction component of the magnetic field rotates in the x-y plane.

In accordance with another aspect of the present invention, a method used in a magnetic field sensor, includes generating a plurality magnetic field sensing element output signals with a corresponding plurality of magnetic field sensing elements. The plurality of magnetic field sensing element output signals is responsive to a magnetic field having a direction component in an x-y plane parallel to the first major surface of the semiconductor substrate, the x-y plane having an x-direction and a y-direction orthogonal to the x-direction. The method also includes generating an x-y angle signal indicative of an angle of the direction component in the x-y plane in response to a signal representative of the plurality of magnetic field sensing element output signals. The method also includes comparing a plurality of threshold values with the x-y angle signal to generate a thresholded signal having at least two states. The thresholded signal is in one of the at least two states at some times and in another one of the at least two states at other times as the direction component of the magnetic field rotates in the x-y plane.

In some embodiments of the above magnetic field sensor and method, the plurality of magnetic field sensing elements comprises a plurality of vertical Hall elements arranged as a CVH sensing element.

BRIEF DESCRIPTION OF THE DRAWINGS

The foregoing features of the invention, as well as the invention itself may be more fully understood from the following detailed description of the drawings, in which:

FIG. 2 is a block diagram showing a signal generated by a TPOS detector when in the presence of a rotating TPOS cam upon a target object configured to rotate;

FIG. 3 is a graph showing a linear output signal that may be generated by an angle sensor when in the presence of the target object configured to rotate in relation to the graph of FIG. 2;

DETAILED DESCRIPTION OF THE INVENTION

Figure 1:
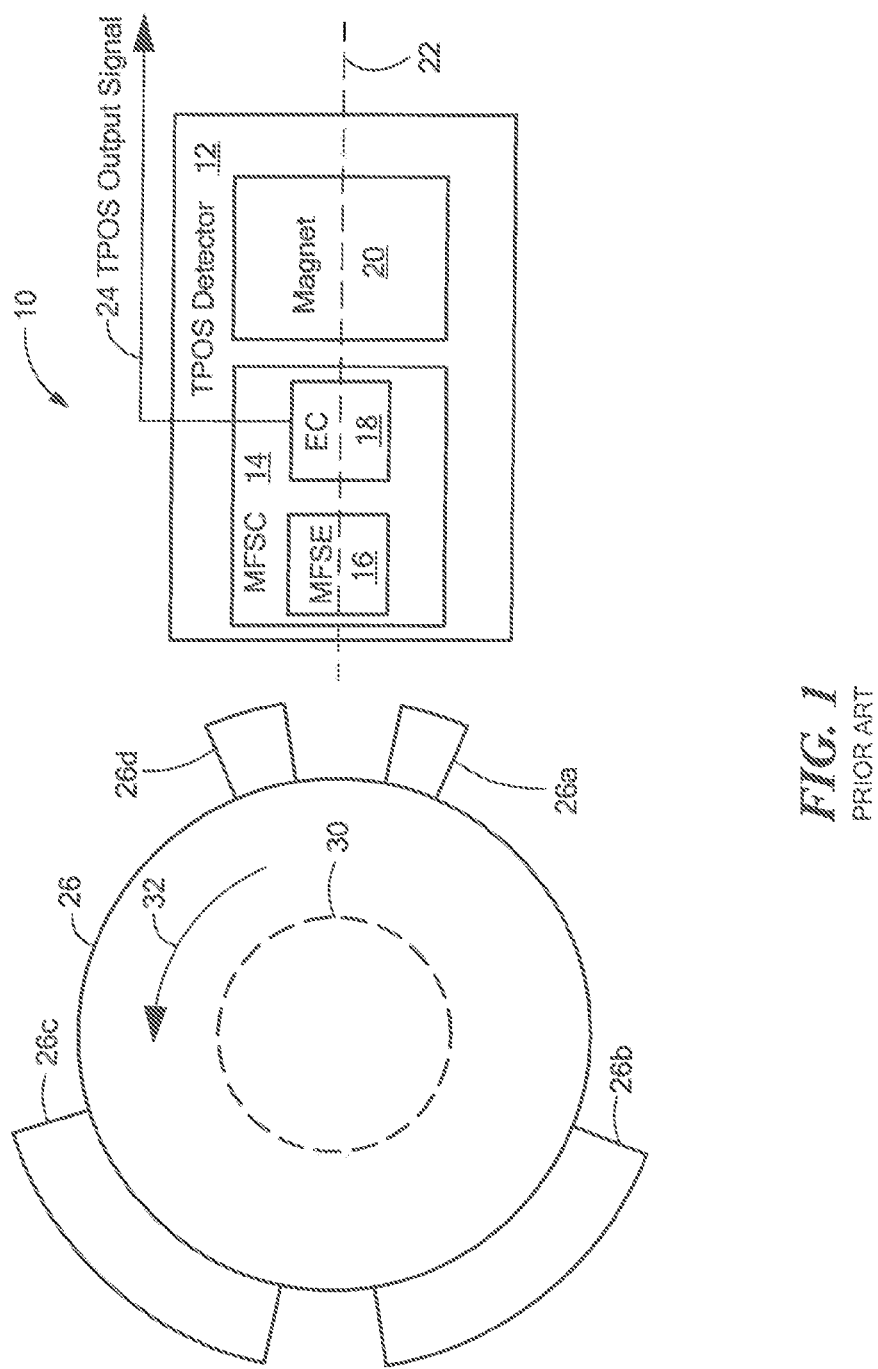
FIG. 1 is a pictorial showing a conventional "true power on state" (TPOS) detector proximate to a TPOS cam having cam features, the TPOS cam disposed upon a shaft configured to rotate, i.e., upon a target object.

Before describing the present invention, some introductory concepts and terminology are explained.

As used herein, the term "magnetic field sensing element" is used to describe a variety of electronic elements that can sense a magnetic field. The magnetic field sensing elements can be, but are not limited to, Hall effect elements, magnetoresistance elements, or magnetotransistors. As is known, there are different types of Hall effect elements, for example, a planar Hall element, a vertical Hall element, and a circular Hall element. As is also known, there are different types of magnetoresistance elements, for example, a giant magnetoresistance (GMR) element, an anisotropic magnetoresistance element (AMR), a tunneling magnetoresistance (TMR) element, an Indium antimonide (InSb) sensor, and a magnetic tunnel junction (MTJ).

A so-called "circular vertical Hall" (CVH) sensing element, which includes a plurality of vertical magnetic field sensing elements, is known and described in PCT Patent Application No. PCT/EP2008056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element includes a circular arrangement of vertical Hall elements arranged over a common circular implant region in a substrate. The CVH sensing element can be used to sense a direction (and optionally a strength) of a magnetic field in a plane of the substrate.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while magnetoresistance elements and vertical Hall elements (including circular vertical Hall (CVH) sensing elements) tend to have axes of sensitivity parallel to a substrate.

While a circular vertical Hall (CVH) magnetic field sensing element, which has a plurality of vertical Hall magnetic field sensing elements, is described in examples below, it should be appreciated that the same or similar techniques and circuits apply to any type of magnetic field sensing elements, including, but not limited to, a plurality of vertical Hall elements not arranged in a CVH structure and a plurality of magnetoresistance elements.

A magnetic field sensor is described below that can replicate signals generated by a conventional "true power on state" (TPOS) detector as used in an automobile. However, it should be apparent that the same techniques and similar circuits can be used to replicate any conventional signal representative of a rotation of an object, in an automobile or in other applications.

Examples below describe a particular TPOS cam as may be used upon an engine camshaft target object. However, similar circuits and techniques can be used with other cams or gears disposed upon the engine camshaft, or upon other rotating parts of an engine (e.g., crank shaft, transmission gear, anti-lock braking system (ABS)), or upon rotating parts of a device that is not an engine.

Referring to FIG. 1, an exemplary TPOS detector arrangement 10 includes a TPOS detector 12. The TPOS detector 12 includes a magnetic field sensing circuit 14 having a magnetic field sensing element 16 coupled to an electronic circuit 18. The TPOS detector 12 can also include a magnet 20. The magnet 20 is configured to generate a magnetic field directed along an axis 22. The electronic circuit 18 is configured to generate a TPOS output signal 24.

The TPOS detector arrangement 10 can also include a TPOS cam 26 having features 26a, 26b, 26c, 26d. The TPOS cam 26 can be disposed, for example, upon a shaft 30 (i.e., a target object) configured to rotate in a direction 32.

In operation, as the TPOS cam 26 rotates, the cam features 26a, 26b, 26c, 26d modulate the magnetic field generated by the magnet 20. Modulations of the magnetic field generated by the magnet 20 are sensed by the magnetic field sensing element 16 and result in state transitions in the TPOS output signal 24.

Particular arrangement and spacing of the cam features 26a, 26b, 26c, 26d results in the TPOS detector 12 being able to provide the TPOS output signal 24 having transitions after only a small number of degrees of rotation of the TPOS cam 26, which can be interpreted by the engine control computer to generate an absolute angle of rotation of the TPOS cam 26 and of the shaft 30 upon which the TPOS cam 26 is disposed.

Referring now to FIG. 2, a graph 60 has a horizontal axis with a scale in units of target object rotation angle, for example, from 0 to 360 degrees. The graph 60 also includes a vertical axis having a scale with units of volts in arbitrary units. A signal 62 can be the same as or similar to the TPOS output signal 24 of FIG. 1 generated by the conventional TPOS detector 12. The signal 62 can include periods 64a, 64b, 64c, 64d in which the signal 62 is in a high state and periods 66a, 66b, 66c, 66d in which the signal 62 is in a low state. It should be appreciated that the high state periods 64a, 64b, 64c, 64d of the signal 62 correspond to the features 26a, 26b, 26c, 26d of the TPOS cam 26 of FIG. 1 as they pass by the magnetic field sensing element 16 of FIG. 1 as the TPOS cam 26 rotates.

In operation, it should be appreciated that an absolute angle of rotation of the cam 26 of FIG. 1, corresponding to and beginning at any point (angle) along the horizontal axis of FIG. 2, can be identified with only a small rotation of the cam 26 of FIG. 1, i.e., as edges of the features 26a-26d pass by the magnetic field sensing element 16. However, when the cam 26 is stationary, the conventional TPOS detector (e.g., 12 of FIG. 1) is only able to identify if it is over a cam tooth or valley, and is unable to identify an absolute or relative angle of rotation.

Referring now to FIG. 3, a graph 50 includes a horizontal axis having a scale in units of target object rotation angle, for example, from 0 to 360 degrees. The graph 50 also includes a vertical scale having a scale with units of volts in arbitrary units. A signal 52 is representative of an output signal that may be generated by an angle sensor that has a linear relationship with respect to angle of rotation from zero to three hundred sixty degrees. A plurality of thresholds is shown along the vertical axis.

While the signal 52 is represented as an analog signal and the thresholds are represented as analog values, it should be appreciated that the signal 52 could instead be comprised of successive digital values and the thresholds could be comprised of digital values.

In operation, the linear signal 52 can be compared against the thresholds as a target object rotates. In this way it will be recognized that the signal 62 of FIG. 2 can be generated by comparison of the signal 52 with the thresholds shown along the vertical axis of FIG. 3. The signal 52, which ramps from zero volts up to a positive voltage as a target object rotates from zero to three hundred sixty degrees, repeats again in a region 52a starting from three hundred sixty degrees and continuing to seven hundred twenty degrees. The signal 52 repeats the saw tooth pattern as the target object rotates.

While the linear signal 52 is shown, in other embodiments, a signal that is nonlinear with respect to rotational angle can also be used and can be compared with other thresholds.

Figure 4:
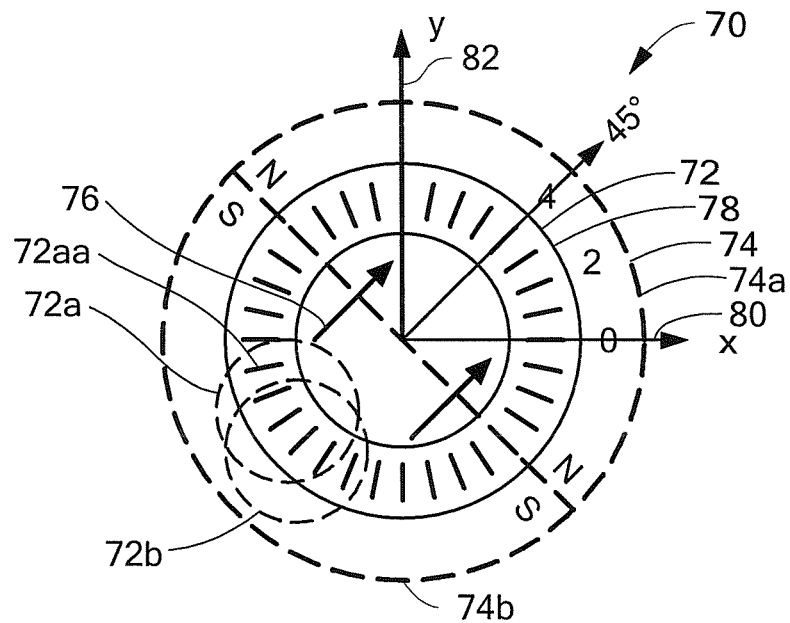
FIG. 4 is a pictorial showing an angle sensing element in the form of a circular vertical Hall (CVH) sensing element, which is proximate to a magnet disposed upon a target object, wherein the angle sensing element, in combination with electronics, can be used to generate the linear output signal of FIG. 3 as the target object rotates.

Referring now to FIG. 4, a circular vertical Hall (CVH) sensing element 72 includes a circular implant region 78 having a plurality of vertical Hall elements disposed thereon, of which a vertical Hall element 72a is but one example. Each vertical Hall element has a plurality of Hall element contacts (e.g., four, five, or six contacts), of which a vertical Hall element contact 72a a is but one example.

A particular vertical Hall element (e.g., 72a) within the CVH sensing element 72, which, for example, can have five adjacent contacts, can share some, for example, four, of the five contacts with a next vertical Hall element (e.g., 72b). Thus, the next vertical Hall element (e.g., 72b) can be shifted by one contact from a prior vertical Hall element. For such shifts by one contact, it will be understood that the number of vertical Hall elements is equal to the number of vertical Hall element contacts, e.g., 32. However, it will also be understood that a different next vertical Hall element can be shifted by more than one contact from the prior vertical Hall element, in which case, there are fewer vertical Hall elements than there are vertical Hall element contacts in the CVH sensing element.

A center of a vertical Hall element 0 is positioned along an x-axis 80 and a center of vertical Hall element 8 is positioned along a y-axis 82. In the exemplary CVH sensing element 72, there are thirty-two vertical Hall elements and thirty-two vertical Hall element contacts. However, a CVH sensing element can have more than or fewer than thirty-two vertical Hall elements and more than or fewer than thirty-two vertical Hall element contacts.

In some applications, a circular magnet 74 having a north side 74a and a south side 74b can be disposed over the CVH 72. The circular magnet 74 tends to generate a magnetic field 76 having a direction from the south side 74b to the north side 74a, here shown to be pointed to a direction of about forty-five degrees relative to x-axis 80.

In some applications, the circular magnet 74 is mechanically coupled to a rotating target object, for example, to an automobile camshaft, and is subject to rotation relative to the CVH sensing element 72. With this arrangement, the CVH sensing element 72 in combination with an electronic circuit described below can generate a signal related to the angle of rotation of the magnet 74. In some embodiments, the output signal has a linear relationship with the angle. In some other embodiments, the output signal has a nonlinear relationship with the angle.

Figure 4A:
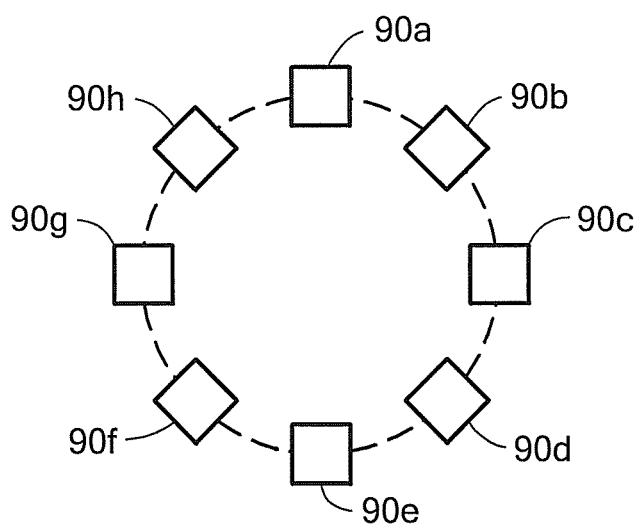
FIG. 4A is a pictorial showing an angle sensing element in the form of a plurality of magnetic field sensing elements, for example, a plurality of vertical Hall sensing elements or a plurality of magnetoresistance elements, that can be used to generate the signal of FIG. 3.

Referring now to FIG. 4A, a plurality of magnetic field sensing elements 90a-90h, in a general case, can be any type of magnetic field sensing elements, for example, vertical Hall sensing elements or magnetoresistance sensing elements. These elements can also be coupled to an electronic circuit. There can also be a magnet the same as or similar to the magnet 74 of FIG. 4, disposed proximate to the sensing elements 80a-80h.

Figure 5:
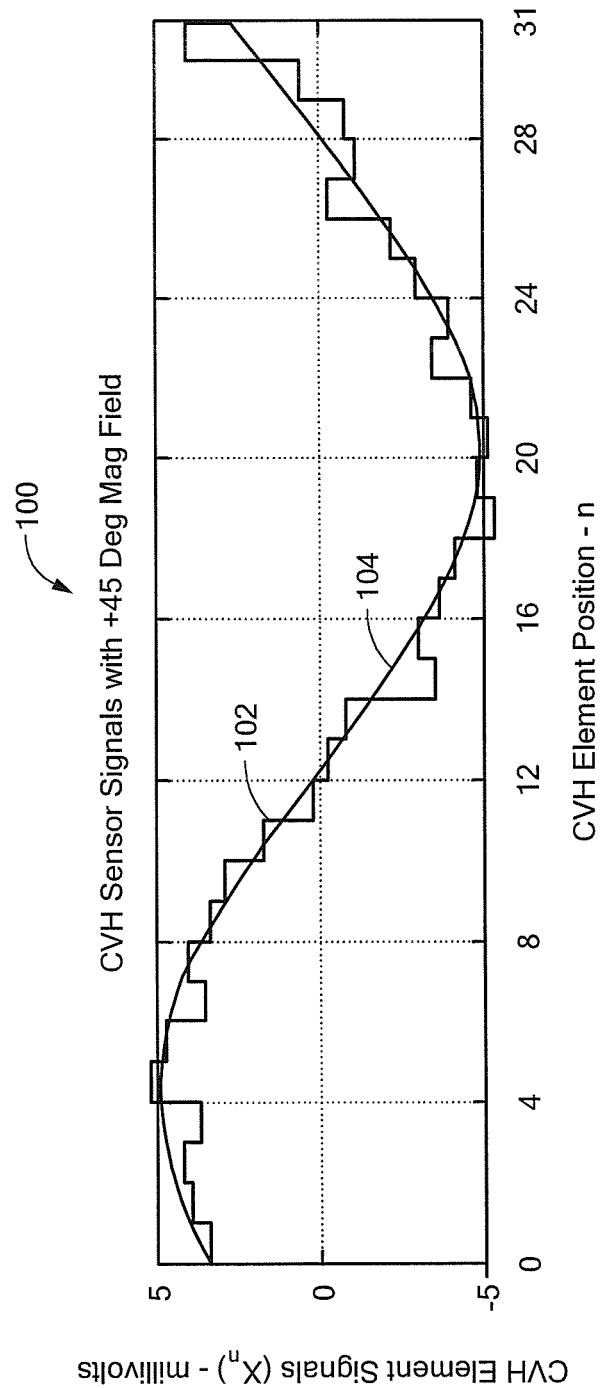
FIG. 5 is a graph showing output signals as may be generated by the CVH sensing element of FIG. 4 or by the plurality of magnetic field sensing elements of FIG. 4A.

Referring now to FIG. 5, a graph 100 has a horizontal axis with a scale in units of CVH vertical Hall element position, n, around a CVH sensing element, for example, the CVH sensing element 72 of FIG. 4. The graph 100 also has a vertical axis with a scale in units of millivolts. The vertical axis is representative of output signal levels from the plurality of vertical Hall elements of the CVH sensing element.

The graph 100 includes a signal 102 representative of output signal levels from the plurality of vertical Hall elements of the CVH sensing element taken with the magnetic field of FIG. 1 pointing in a direction of forty-five degrees.

Referring briefly to FIG. 4, as described above, vertical Hall element 0 is centered along the x-axis 80 and vertical Hall element 8 is centered along the y-axis 82. In the exemplary CVH sensing element 72, there are thirty-two vertical Hall element contacts and a corresponding thirty-two vertical Hall elements, each vertical Hall element having a plurality of vertical Hall element contacts, for example, five contacts.

In FIG. 5, a maximum positive signal is achieved from a vertical Hall element centered at position 4, which is aligned with the magnetic field 76 of FIG. 4. A maximum negative signal is achieved from a vertical Hall element centered at position 20, which is also aligned with the magnetic field 76 of FIG. 1.

A sine wave 104 is provided to more clearly show the ideal behavior of the signal 102. The signal 102 has variations due to vertical Hall element offsets, which tend to somewhat randomly cause element output signals to be too high or too low relative to the sine wave 104, in accordance with offset errors for each element. The offset signal errors are undesirable.

Full operation of the CVH sensing element 72 of FIG. 4 and generation of the signal 102 of FIG. 5 are described in more detail in the above-described PCT Patent Application No. PCT/EP2008056517, entitled "Magnetic Field Sensor for Measuring Direction of a Magnetic Field in a Plane," filed May 28, 2008, which is published in the English language as PCT Publication No. WO 2008/145662.

As will be understood from PCT Patent Application No. PCT/EP2008056517, in some embodiments, in order to reduce offset voltages, groups of contacts of each vertical Hall element can be used in a multiplexed or chopped arrangement to generate chopped output signals from each vertical Hall element. Thereafter, a new group of adjacent vertical Hall element contacts can be selected (i.e., a new vertical Hall element), which can be offset by one element from the prior group. The selected new group can be used in the multiplexed or chopped arrangement to generate another chopped output signal from the selected next group, and so on.

Each step of the signal 102 can be representative of a chopped output signal from one respective group of vertical Hall element contacts, i.e., from one respective vertical Hall element. However, in other embodiments, no chopping is performed and each step of the signal 102 is representative of an unchopped output signal from one respective group of vertical Hall element contacts, i.e., from one respective vertical Hall element. Thus, the signal 102 is representative of a CVH output signal with or without the above-described grouping and chopping of vertical Hall elements.

It will be understood that, using techniques described above in PCT Patent Application No. PCT/EP2008056517, a phase of the signal 102 can be used to identify the pointing direction of the magnetic field 76 of FIG. 4 relative to the CVH lsensiong element 72. It will also be understood that, unlike a conventional TPOS detector, the absolute and/or relative angle of rotation of a target object can be determined even when the target object is stationary. As described above, with a conventional TPOS detector, when the target object is stationary, it is only possible to identify if the TPOS detector is over a tooth or over a valley of the TPOS cam.

Figure 6:
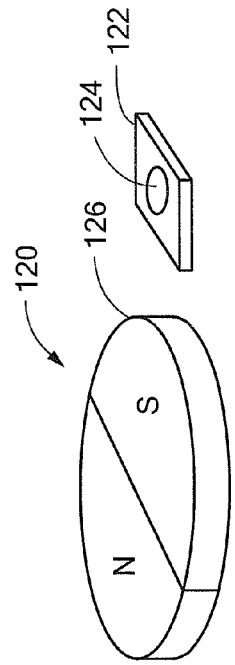
FIG. 6 is a pictorial showing a CVH sensing element proximate to circular magnet having two poles.

Referring now to FIG. 6, a magnetic arrangement 110 can include a circuit substrate 112 upon which a CVH sensing element 114 is disposed. The circuit substrate 112, which includes the CVH sensing element 114 and other circuitry, forms a TPOS detector. A circular magnet 116 having north and south poles can be disposed proximate to the circuit substrate 112. In this arrangement, a center of the CVH sensing element 114 is disposed at a position along an axis of rotation of the circular magnet 116.

Figure 6A:
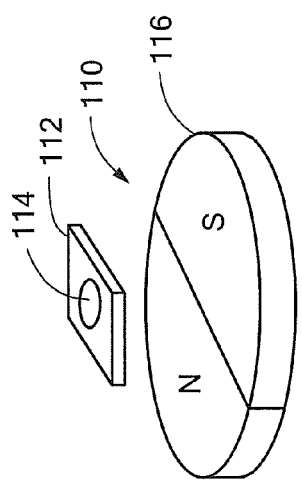
FIG. 6A is a pictorial showing a CVH sensing element proximate to circular magnet having two poles but in a different arrangement than the arrangement of FIG. 6.

Referring now to FIG. 6A, another TPOS arrangement 120 can include a circuit substrate 122 upon which a CVH sensing element 124 is disposed. The circuit substrate 122, which includes the CVH sensing element 124 and other circuitry, forms a TPOS detector. A circular magnet 126 having north and south poles can be disposed proximate to the circuit substrate 122. In this arrangement the CVH sensing element 124 is disposed in a plane parallel to a plane of a major surface of the circular magnet 126.

With both the arrangement of FIG. 6 and the arrangement of FIG. 6A, respective CVH sensing elements 114, 124 are responsive to a rotation angle of a respective one of the circular magnets 116, 126.

Figure 7:
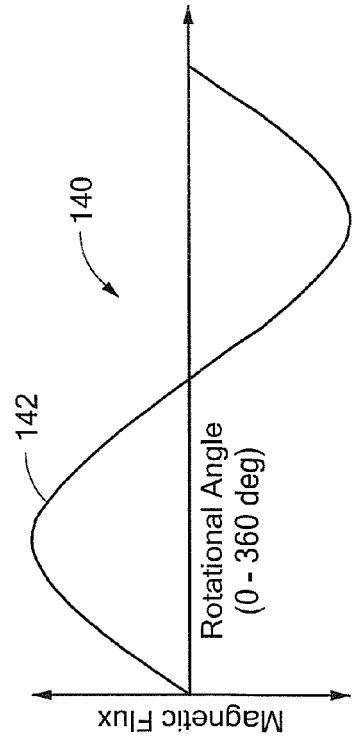
FIG. 7 is a pictorial showing another CVH sensing element proximate to circular magnet having two poles and showing the circular magnet in rotation.

Referring now to FIG. 7 yet another TPOS arrangement 130 can include a circuit substrate 132 upon which a CVH sensing element 134 is disposed. The circuit substrate 132, which includes the CVH sensing element 134 and other circuitry, forms a TPOS detector. A circular magnet 136 having north and south poles can be disposed proximate to the circuit substrate 132. The magnet 136 can be coupled to an end of a shaft (not shown), i.e., a target object, which is configured to rotate as indicated by an arrow 138.

Figure 8:
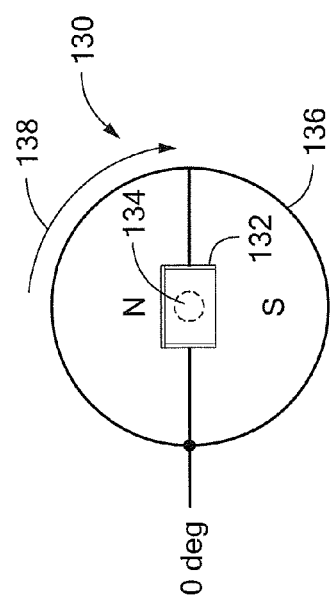
FIG. 8 is a graph showing a magnetic flux as may be experienced by the CVH sensing element of FIG. 7 as the magnet rotates through one revolution.

Referring now to FIG. 8, a graph 140 includes horizontal axis with a scale in units of rotational angle of the magnet 136 of FIG. 7 from zero to three hundred sixty degrees. The graph 140 also includes a vertical axis with a scale corresponding to magnetic flux in arbitrary units. A signal 142 is representative of magnetic flux experienced by the CVH sensing element 134 as the magnet 136 rotates.

Figure 9:
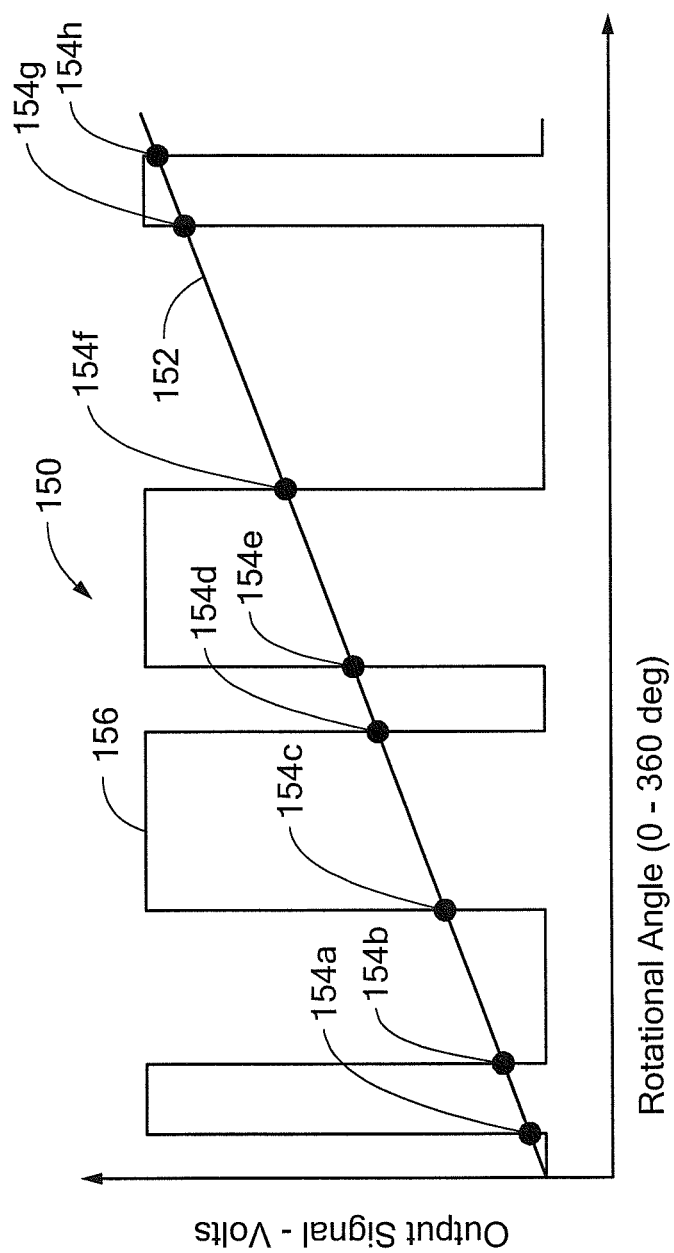
FIG. 9 is a graph showing a linear output signal that may be generated from the CVH sensing element of FIG. 7 as the magnet rotates through one revolution, showing thresholds that may be applied to the linear output signal, and showing a TPOS output signal that can be generated in conjunction with the thresholds.

Referring now to FIG. 9, a graph 150 includes horizontal axis with a scale in units of rotation angle of the magnet 136 of FIG. 7 from zero to three hundred sixty degrees. The graph 150 also includes a vertical axis having a scale in units of volts in arbitrary units. A signal 152 is representative of a processed output signal as may be generated by the TPOS detector 132 of FIG. 7 as the magnet 136 rotates. A plurality of threshold values 154a, 154b, 154c, 154d, 154e, 154f, 154g, 154h can be compared with the signal 152. A signal 156, which can be the same as or similar to the signal 62 of FIG. 2, can be generated by the above comparing. In this way the signal 156 can be generated without a TPOS cam, such as the TPOS cam 26 of FIG. 1 coupled to the target object, but instead, with a magnetic, e.g., the magnet 136 of FIG. 7, coupled to the target object. In other words, the signal 156 can be generated using only the rotating magnet 136 of FIG. 7 in conjunction with an angle sensor such as the CVH sensing element 134 of FIG. 7.

Figure 10:
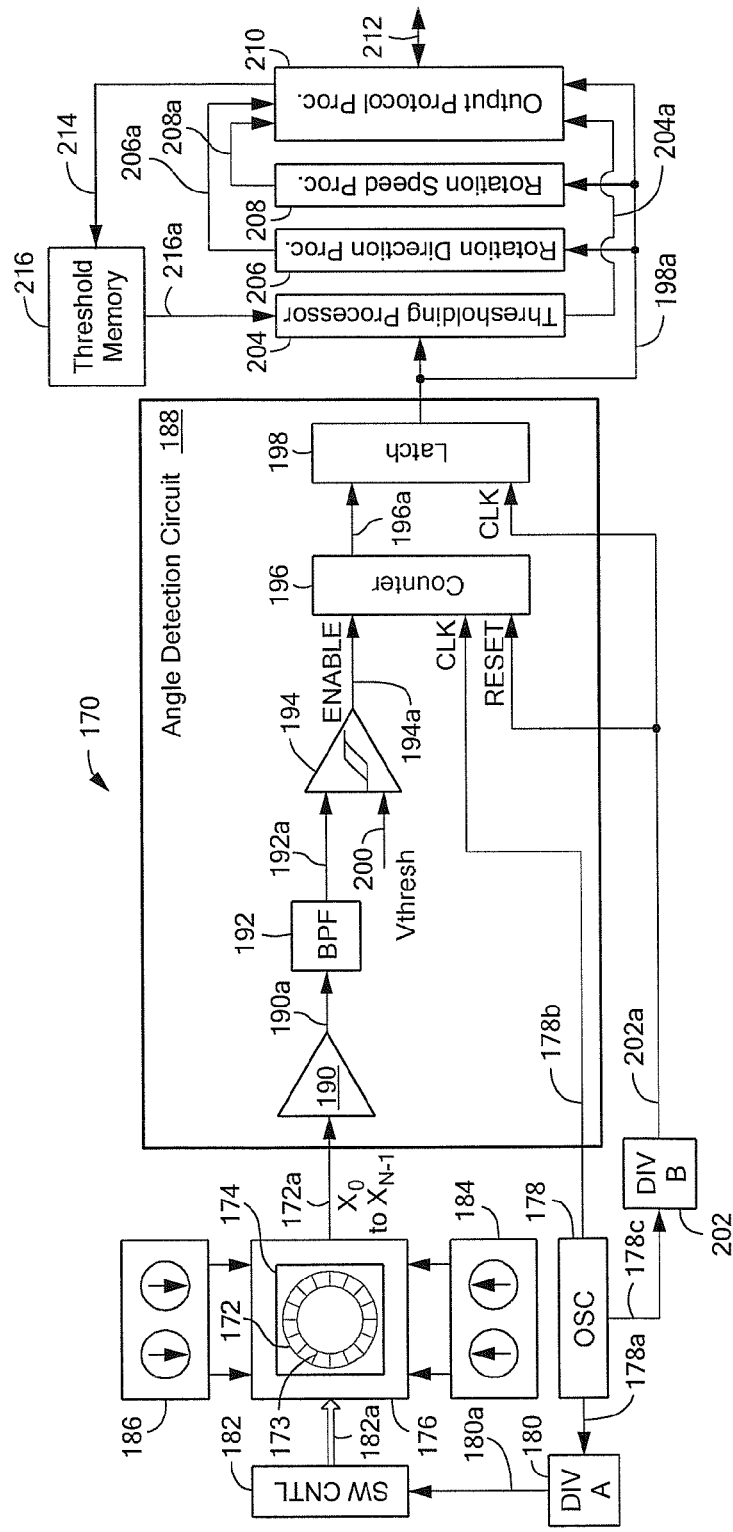
FIG. 10 is a block diagram showing a CVH sensing element, an angle detection circuit, a threshold processor, a memory to hold threshold value used by the threshold processor, a rotation direction processor, a rotation speed processor, and an output protocol processor.

Referring now to FIG. 10, a TPOS detector 170 can include a CVH sensing element 172 having a plurality of vertical Hall elements, each vertical Hall element comprising a group of vertical Hall element contacts (e.g., five vertical Hall element contacts), of which a vertical Hall element contact 173 is but one example.

In some embodiments, the TPOS detector 170 is responsive to a magnet (not shown), which can be the same as or similar to the magnet 74 of FIG. 4. The magnet can be coupled to a target object (not shown), for example, a camshaft on an engine.

In some embodiments, a switching circuit 174 can provide a CVH output signal 172a, having components $x_n = x_0$ to $x_{N-1}$, where n is equal to a vertical Hall element position (i.e., a position of a group of vertical Hall element contacts that form a vertical Hall element) in the CVH sensing element 172, and where there are N such positions. The CVH output signal 172a can be the same as or similar to the signal 102 of FIG. 5.

In some embodiments, the CVH output signal 172a is comprised of sequential output signals taken one-at-a-time around the CVH sensing element 172, wherein each output signal is generated on the same signal path.

In one particular embodiment, the number of vertical Hall elements (each comprising a group of vertical Hall element contacts) in the CVH sensing element 172 is equal to the total number of sensing element positions, N. In other words, the CVH output signal 172a can be comprised of sequential output signals, wherein each one of the CVH output signals 172a is associated with a respective one of the vertical Hall elements in the CVH sensing element 172, i.e., the circuit 100 steps around the vertical Hall elements of the CVH sensing element 172 by increments of one, and N equals the number of vertical Hall elements in the CVH sensing element 172. However, in other embodiments, the increments can be by greater than one vertical Hall element, in which case N is less than the number of vertical Hall elements in the CVH sensing element 172.

In one particular embodiment, the CVH sensing element 172 has thirty-two vertical Hall elements, i.e., N=32, and each step is a step of one vertical Hall element contact position (i.e., one vertical Hall element position). However, in other embodiments, there can be more than thirty-two or fewer than thirty-two vertical Hall elements in the CVH sensing element 172. Also, the increments of vertical Hall element positions, n, can be greater than one vertical Hall element contact.

In some embodiments, another switching circuit 176 can provide the above-described "chopping" of groups of the vertical Hall elements within the CVH sensing element 172. As described above, chopping will be understood to be an arrangement in which a group of vertical Hall element contacts, for example, five vertical Hall element contacts, are driven with current sources 184, 186 in a plurality of connection configurations, and signals are received from the group of vertical Hall element contacts in corresponding configurations. Thus, in accordance with each vertical Hall element position, n, there can be a plurality of output signals during the chopping, and then the group increments to a new group, for example, by an increment of one vertical Hall element contact.

The circuit 170 can include an oscillator 178 that generates clock signals 178a, 178b, which can have the same or different frequencies. A divider 180 is coupled to receive the clock signal 178a and configured to generate a divided clock signal 180a. A switch control circuit 182 is coupled to receive the divided clock signal 180a and configured to generate switch control signals 182a, which are received by the switching circuits 174, 176 to control the sequencing around the CVH sensing element 172, and, optionally, to control chopping of groups of vertical Hall elements within the CVH sensing element 172 in ways described above.

The circuit 170 can include a divider 202 coupled to receive the clock signal 178c and configured to generate a divided clock signal 202a.

The TPOS detector 170 can include an angle detection circuit 188 coupled to receive the signal 172a representative of signals generated by the CVH sensing element 172. An amplifier 190 can be coupled to receive the output signal 172a and configured to generate an amplified signal 190a. A bandpass filter 192 can be coupled to receive the amplified signal 190a and configured to generate a filtered signal 192a. It will be understood that the filtered signal 192a is like the signal 102 of FIG. 5, but filtered, thereby having steps smaller than the steps of the signal 102.

A comparator 194 can be coupled to receive the filtered signal 192a. The comparator 194 can also be coupled to receive a threshold signal 200. The comparator 194 can be configured to generate a comparison signal 194a by comparing the filtered signal 192a with the threshold signal 200.

A counter can be coupled to receive the clock signal 178b at a clock input, coupled to receive the comparison signal 194a at an enable input, and coupled to receive the clock signal 202a at a reset input. The counter 196 is configured to generate a count signal 196a, which is a digital signal. The count signal 196*a* is representative of a phase between the comparison signal 194*a* and the clock signal 178*b*.

A latch 198 can be coupled to receive the count signal 196*a* at a data input and coupled to receive the clock signal 202*a* at a clock input. The latch 198 can be configured to generate a latched signal 198*a*, also referred to herein as an x-y angle signal.

As described more fully in the above mentioned PCT Patent Application No. PCT/EP2008056517, it will be understood that the latched signal 198 a is a digital signal representative of an angle of a direction of a magnetic field experienced by the CVH sensing element 172, i.e. an angle of the target object to which the magnet is coupled. In some arrangements, the latched signal 198*a* (x-y angle signal) is a digital signal having values that are linearly related to an angle of rotation of a direction of the magnetic field experienced by the CVH sensing element 172, i.e., and angle of rotation of the target object. Thus, the digital values of the latched signal 198*a* a can be represented graphically like the signal 152 of FIG. 9.

In other embodiments, the latched signal 198*a* is a digital signal having values that are not linearly related to an angle of rotation of a direction of the magnetic field experienced by the CVH sensing element 172.

The TPOS detector 170 can also include a thresholding processor 204 coupled to receive the latched signal 198*a*. The thresholding processor 204 can also be coupled to receive threshold values 216*a* from a threshold memory device 216. The threshold values 216*a* can be like the threshold values 154*a*, 154*b*, 154*c*, 154*d*, 154*e*, 154*f*, 154*g*, 154*h* shown in FIG. 9 and like the threshold values shown on the vertical axis of FIG. 3.

In operation, the thresholding processor 204 can be configured to compare the latched signal 198*a* the threshold values 216*a*. The comparing is described in further detail below in conjunction with FIG. 11. Let it suffice here to say that, by way of the comparing, as represented in FIG. 9, the thresholding processor 204 can be configured to generate a thresholded signal 204*a*, which can be the same as or similar to the TPOS signal 156 of FIG. 9 and the same as or similar to the TPOS signal 62 of FIG. 2. Thus, with this arrangement, the TPOS detector 170 can generate the thresholded signal 204*a* the same as or similar to a conventional TPOS signal like the conventional TPOS signal 62 of FIG. 2 generated by the conventional TPOS detector 12 of FIG. 1.

The TPOS detector 170 can also include a rotation direction processor 206 coupled to receive the latched signal 198*a* (x-y angle signal). The rotation direction processor 206 can identify a direction of rotation of the angle of the magnetic field experienced by the CVH sensing element 172.

It will be understood that, because the magnetic field sensor 170 provides the x-y angle signal 198*a* having values that are linearly related to an angle of rotation of a direction of the magnetic field experienced by the CVH sensing element 172, i.e., an angle of rotation of the target object, identification of the direction of rotation is straightforward.

The rotation direction processor 206 is configured to generate a rotation direction output signal 206*a* indicative of the direction of rotation of the target object.

The TPOS detector 170 can also include a rotation speed processor 208 coupled to receive the x-y angle signal 198*a*. The rotation speed processor 208 can identify a speed of rotation of the angle of the magnetic field experienced by the CVH sensing element 172.

It will be understood that, because the magnetic field sensor 170 provides the x-y angle signal 198*a* having values that are linearly related to an angle of rotation of a direction of the magnetic field experienced by the CVH sensing element 172, i.e., an angle of rotation of the target object, identification of the speed of rotation can be obtained by comparing degrees of rotation to a frequency of a fixed clock signal (not shown). Knowing the number of clock cycles per degree of rotation can yield a simple mathematical solution for speed of rotation.

The rotation speed processor 208 is configured to generate a rotation speed output signal 208*a* indicative of the speed of rotation of the target object.

The TPOS detector 170 can also include an output protocol processor 210 coupled to receive at least one of the latched signal 198 a (the x-y angle signal), which is representative of an angle of the magnetic field experienced by the CVH sensing element 172 (i.e., an angle of rotation of the target object), the thresholded signal 204*a*, which is the same as or similar to the TPOS signal 156 of FIG. 9, the rotation direction output signal 206*a*, or the rotation speed signal 208*a*. The output protocol processor 210 can be configured to reformat one or more of the above-mentioned signals to generate an output signal 212 in a format, for example, a SENT format, an I2C format, a pulse width modulated (PWM) format, and a VDA format.

The output protocol processor 210 can also be configured to receive a command signal 212, which can include threshold values 214 received by the threshold memory device 216 for storage. With this arrangement a user of the TPOS detector 170 can send threshold values to the TPOS detector 170, resulting in selection of edge positions of the thresholded signal 204*a*.

While the magnetic field sensor 170 is shown to have a CVH sensing element 172, which can be the same as or similar to the CVH sensing element 72 of FIG. 4, in other embodiments, the CVH sensing element 172 can be replaced by a plurality of magnetic field sensing elements, for example, the plurality of magnetic field sensing elements 90*a*-90*h* of FIG. 4A. One of ordinary skill in the art will understand how to modify some of the front end sections of the magnetic field sensor 170 to use magnetoresistance elements, or other types of magnetic field sensing elements described in conjunction with FIG. 4A.

Figure 11:
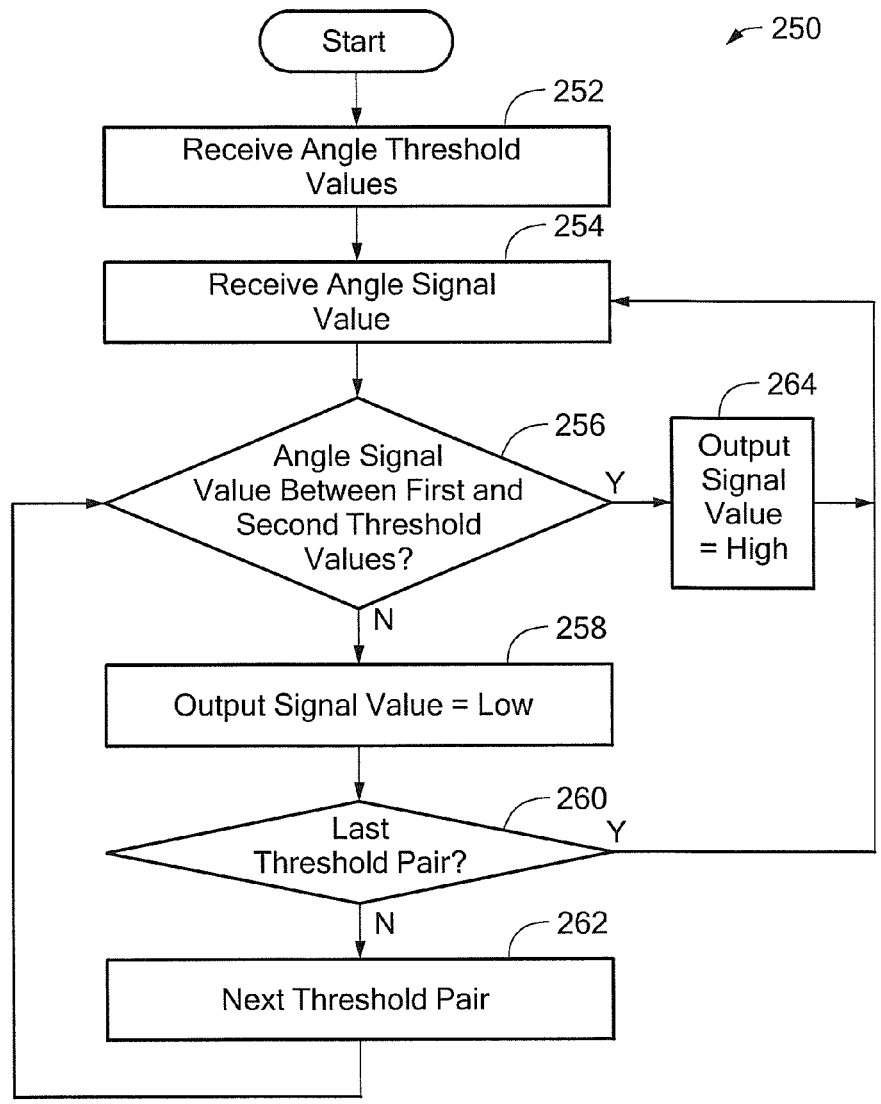
FIG. 11 is a flow chart showing a process that may be used by the threshold processor of FIG. 10.

It should be appreciated that FIG. 11 shows a flowchart corresponding to the below contemplated technique which would be implemented in the thresholding processor 204 of FIG. 10. Rectangular elements (typified by element 252 in FIG. 11), herein denoted "processing blocks," represent computer software instructions or groups of instructions. Diamond shaped elements (typified by element 256 in FIG. 11), herein denoted "decision blocks," represent computer software instructions, or groups of instructions, which affect the execution of the computer software instructions represented by the processing blocks.

Alternatively, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention.

Thus, unless otherwise stated the blocks described below are unordered meaning that, when possible, the steps can be performed in any convenient or desirable order.

Referring now to FIG. 11, a process 250 can be used by the thresholding processor 204 of FIG. 10. The process 250 begins at box 252, where angle threshold values are received by the thresholding processor 204 of FIG. 10, for example, angle threshold values 216*a* of FIG. 10.

At box 254, angle signal values are received by the thresholding processor 204, for example, angle signal values within the latched signal 198*a* of FIG. 10.

At box 256, received angle signal values are compared with received angle threshold values. If, at box 256, the angle signal value is not between first and second threshold values, the process proceeds to box 258. The first and second threshold values can be, for example, the lowest two threshold values shown along the vertical axis of FIG. 3.

At box 258, an output signal value is set to be low. For example, the thresholded signal 204*a* of FIG. 10 can be set to a low state.

At box 260, it is determined if the threshold pair used at box 256 is a last threshold pair. If the threshold pair is not the last threshold pair, then at box 262, another threshold pair is selected. For example, third and fourth thresholds along the vertical axis of FIG. 3 can be selected at box 262. The process then returns to box 256.

If, at box 256, the angle signal value is between first and second threshold values, the process proceeds to box 264. At box 264, the output signal value is set to be high. For example, the thresholded signal 204*a* of FIG. 10 can be set to a high state. The process then returns to box 254 where a next angle signal value is received.

At box 260, if the threshold pair being processed is the last threshold pair, then the process returns to box 254.

While a TPOS cam is described above that has four teeth or features, a TPOS cam with more than or fewer than four features can also be used. In general, the number of teeth is represented by the same number of thresholds (see, e.g., FIGS. 2 and 3.

While a TPOS cam is described above, the sensed object upon the target object can instead be a gear with any number of regularly spaced teeth, and/or with any number of irregularly spaced teeth. As described above, in general, the number of teeth is represented by the same number of thresholds (see, e.g., FIGS. 2 and 3).

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor for sensing a position of a target object configured to rotate, comprising:
    a semiconductor substrate;
    a plurality of magnetic field sensing elements disposed on the semiconductor substrate, wherein the plurality of magnetic field sensing elements is configured to generate a respective plurality of magnetic field sensing element output signals responsive to a magnetic field having a direction component in an x-y plane parallel to a first major surface of the semiconductor substrate, the x-y plane having an x-direction and a y-direction orthogonal to the x-direction;
    an angle detection circuit coupled to receive a signal representative of the plurality of magnetic field sensing element output signals, and configured to generate an x-y angle signal indicative of an angle of the direction component of the magnetic field in the x-y plane; and
    a thresholding processor coupled to receive the x-y angle signal, configured to compare a plurality of threshold values with the x-y angle signal to generate a thresholded signal having at least two states, wherein the thresholded signal is in one of the at least two states at some times and in another one of the at least two states at other times as the direction component of the magnetic field rotates in the x-y plane.

2. The magnetic field sensor of claim 1, wherein the plurality of magnetic field sensing elements comprises a plurality of vertical Hall elements arranged as a circular vertical Hall (CVH) structure, wherein each one of the plurality of vertical Hall elements is arranged upon a common circular implant region.

3. The magnetic field sensor of claim 2, wherein the plurality of vertical Hall elements, the angle detection circuit, and the thresholding circuit are disposed upon a common substrate.

4. The magnetic field sensor of claim 2, wherein the x-y angle signal is linearly related to the angle of the direction component of the magnetic field.

5. The magnetic field sensor of claim 2, wherein the plurality of threshold values is selected to result in the thresholded signal being substantially the same as a known true power on state (TPOS) signal used in an engine control system.

6. The magnetic field sensor of claim 2, further comprising:
    a memory device configured to receive and store the plurality of threshold values, wherein the thresholding circuit is coupled to receive the plurality of threshold values from the memory device.

7. The magnetic field sensor of claim 6, wherein the plurality of threshold values is selected to result in the thresholded signal being substantially the same as a known true power on state (TPOS) signal used in an engine control system.

8. The magnetic field sensor of claim 6, wherein the memory device is configured to receive the plurality of threshold values from outside of the magnetic field sensor.

9. The magnetic field sensor of claim 2, further comprising:
    a rotation speed processor coupled to receive the x-y angle signal and configured to generate a rotation speed signal indicative of a speed of rotation of the object by identifying a rate of angle change represented by the x-y angle signal.

10. The magnetic field sensor of claim 9, further comprising:
    a rotation direction processor coupled to receive the x-y angle signal and configured to generate a rotation direction signal indicative of a direction of rotation of the object by identifying direction of angle change represented by the x-y angle signal.

11. The magnetic field sensor of claim 10, further comprising:
    an output protocol processor coupled to receive the thresholded signal and at least one of the rotation speed signal or the rotation direction signal, and configured to generate an output signal representative of the thresholded signal and representative of at least one of the rotation speed signal or the rotation direction signal, wherein the output signal is in a format selected from among a SENT format, an I2C format, a pulse width modulated (PWM) format, or a VDA format.

12. The magnetic field sensor of claim 2, further comprising:
an output protocol processor coupled to receive the thresholded signal, and configured to generate an output signal representative of the thresholded signal, wherein the output signal is in a format selected from among a SENT format, an I2C format, a pulse width modulated (PWM) format, or a VDA format.

13. The magnetic field sensor of claim 2, further comprising:
a magnet disposed proximate to the plurality of magnetic field sensing elements and coupled to the target object, the magnet to generate the magnetic field, wherein the magnet comprises a disk magnet for which half of the disk magnet is polarized in a first direction and the other half of the disk magnet is polarized in a second direction opposite from the first direction, wherein the disk magnet is affixed to the object.

14. The magnetic field sensor of claim 13, wherein the disk magnet has a generally round shape with a center, wherein an axis of rotation of the disk magnet intersects the center, and wherein the disk magnet is disposed such that the axis of rotation also intersects a center of the CVH structure.

15. The magnetic field sensor of claim 13, wherein the disk magnet has a generally round shape with a center, wherein an axis of rotation of the disk magnet intersects the center, and wherein the disk magnet is disposed such that the axis of rotation does not intersect a center of the CVH structure, wherein the disk magnet is disposed such that a major plane of the disk magnet is in the same plane as a major plane of the CVH structure.

16. The magnetic field sensor of claim 1, wherein the plurality of magnetic field sensing elements comprises a plurality of magnetoresistance elements.

17. A method used in a magnetic field sensor, comprising:
generating a plurality magnetic field sensing element output signals with a corresponding plurality of magnetic field sensing elements disposed on a semiconductor substrate, wherein the plurality of magnetic field sensing element output signals is responsive to a magnetic field having a direction component in an x-y plane parallel to a first major surface of the semiconductor substrate, the x-y plane having an x-direction and a y-direction orthogonal to the x-direction;
generating an x-y angle signal indicative of an angle of the direction component in the x-y plane in response to a signal representative of the plurality of magnetic field sensing element output signals; and
comparing a plurality of threshold values with the x-y angle signal to generate a thresholded signal having at least two states, wherein the thresholded signal is in one of the at least two states at some times and in another one of the at least two states at other times as the direction component of the magnetic field rotates in the x-y plane.

18. The method of claim 17, wherein the plurality of magnetic field sensing elements comprises a plurality of vertical Hall elements arranged as a circular vertical Hall (CVH) structure, wherein each one of the plurality of vertical Hall elements is arranged upon a common circular implant region.

19. The method of claim 18, wherein the plurality of vertical Hall elements, the angle detection circuit, and the thresholding circuit are disposed upon a common substrate.

20. The method of claim 18, wherein the x-y angle signal is linearly related to the angle of the direction component of the magnetic field.

21. The method of claim 18, further comprising:
selecting the plurality of threshold values to result in the thresholded signal being substantially the same as a known true power on state (TPOS) signal used in an engine control system.

22. The method of claim 18, further comprising:
receiving and storing the plurality of threshold values with a memory device.

23. The method of claim 22, wherein the memory device is configured to receive the plurality of threshold values from outside of the magnetic field sensor.

24. The method of claim 18, further comprising:
processing the x-y angle signal to generate a rotation speed signal indicative of a speed of rotation of the object by identifying a rate of state transitions in the thresholded signal.

25. The method of claim 24, further comprising:
processing the x-y angle signal to generate a rotation direction signal indicative of a direction of rotation of the object by identifying a pattern of state transitions in the thresholded signal.

26. The method of claim 25, further comprising:
processing the thresholded signal and at least one of the rotation speed signal or the rotation direction signal to generate an output signal representative of the thresholded signal and representative of at least one of the rotation speed signal or the rotation direction signal, wherein the output signal is in a format selected from among a SENT format, an I2C format, a pulse width modulated (PWM) format, or a VDA format.

27. The method of claim 18, further comprising:
processing the thresholded signal to generate an output signal representative of the thresholded signal, wherein the output signal is in a format selected from among a SENT format, an I2C format, a pulse width modulated (PWM) format, or a VDA format.

28. The method of claim 17, wherein the plurality of magnetic field sensing elements comprises a plurality of magnetoresistance elements.

* * * * *

UNITED STATES PATENT AND TRADEMARK OFFICE
CERTIFICATE OF CORRECTION

| | | |
|---|---|---|
| PATENT NO. | : 9,182,456 B2 | Page 1 of 1 |
| APPLICATION NO. | : 13/413037 | |
| DATED | : November 10, 2015 | |
| INVENTOR(S) | : Eric Shoemaker et al. | |

It is certified that error appears in the above-identified patent and that said Letters Patent is hereby corrected as shown below:

Title Page item (57) Abstract, line 1 delete "and" and replace with --an--.

Specification

Column 3, line 47 delete "plurality magnetic" and replace with --plurality of magnetic--.

Column 4, line 34 delete "to circular" and replace with --to a circular--.

Column 4, line 37 delete "to circular" and replace with --to a circular--.

Column 8, line 47 delete "1sensing" and replace with --sensing--.

Column 9, lines 37-38 delete "magnetic," and replace with --magnet,--.

Column 11, line 8 delete "above mentioned" and replace with --above-mentioned--.

Column 11, line 17 delete ", and" and replace with --, an--.

Column 11, line 34 delete "198a the" and replace with --198a to the--.

Column 12, line 13 delete "198 a" and replace with --198a--.

Claims

Column 13, line 53 Claim 1, delete "that that" and replace with --that the--.

Column 15, line 39 Claim 17, delete "plurality magnetic" and replace with --plurality of magnetic--.

Signed and Sealed this
Twenty-fourth Day of May, 2016

Michelle K. Lee
*Director of the United States Patent and Trademark Office*